(12) United States Patent
Inuma et al.

(10) Patent No.: US 12,188,977 B2
(45) Date of Patent: Jan. 7, 2025

(54) CONTACT PROBE, PROBE HOLDER AND PROBE UNIT

(71) Applicant: NHK Spring Co., Ltd., Yokohama (JP)

(72) Inventors: Tsuyoshi Inuma, Kanagawa (JP); Shuji Takahashi, Kanagawa (JP); Kazuya Soma, Kanagawa (JP); Takashi Nidaira, Kanagawa (JP); Yuya Hironaka, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 137 days.

(21) Appl. No.: 17/911,827

(22) PCT Filed: Mar. 17, 2021

(86) PCT No.: PCT/JP2021/010922
§ 371 (c)(1),
(2) Date: Sep. 16, 2022

(87) PCT Pub. No.: WO2021/193304
PCT Pub. Date: Sep. 30, 2021

(65) Prior Publication Data
US 2023/0138105 A1 May 4, 2023

(30) Foreign Application Priority Data

Mar. 24, 2020 (JP) ................................. 2020-053388

(51) Int. Cl.
*G01R 1/073* (2006.01)
*G01R 1/04* (2006.01)
(Continued)

(52) U.S. Cl.
CPC ..... *G01R 31/2863* (2013.01); *G01R 1/07314* (2013.01)

(58) Field of Classification Search
CPC ..................... G01R 1/07314; G01R 31/2863
See application file for complete search history.

(56) References Cited

U.S. PATENT DOCUMENTS

| 6,917,525 B2 | 7/2005 | Mok et al. |
| 8,535,101 B2 * | 9/2013 | Suzuki ............... G01R 1/07314 439/626 |

(Continued)

FOREIGN PATENT DOCUMENTS

| JP | 2006-507479 A | 3/2006 |
| JP | 2010-175371 A | 8/2010 |

(Continued)

OTHER PUBLICATIONS

Office Action dated Oct. 12, 2021, issued for Taiwan Patent Application No. 11020990850 and English translation thereof.

(Continued)

*Primary Examiner* — Alesa Allgood
(74) *Attorney, Agent, or Firm* — Locke Lord LLP

(57) ABSTRACT

A probe unit includes: a plurality of first contact probes each coming into contact with an electrode to be contacted on one end side in a longitudinal direction; a second contact probe connected to an external ground; and a probe holder configured to hold the first and second contact probes, the probe holder including a first hollow portion configured to allow the first contact probes to be inserted therethrough and hold the first contact probes, a second hollow portion configured to allow the second contact probe to be inserted therethrough and hold the second contact probe, and a through-hole provided around the first hollow portion, wherein the probe holder includes a conductive portion that constitutes the through-hole and electrically connects the through-hole and the second contact probe.

10 Claims, 9 Drawing Sheets

(51) Int. Cl.
  *G01R 1/067*  (2006.01)
  *G01R 31/28*  (2006.01)

(56)     References Cited

U.S. PATENT DOCUMENTS

| | | |
|---|---|---|
| 11,143,675 B2 | 10/2021 | Hsieh et al. |
| 11,293,946 B2 | 4/2022 | Hironaka et al. |
| 2002/0113611 A1* | 8/2002 | Goto .................. G01R 1/07371 |
| | | 324/756.03 |
| 2010/0188112 A1 | 7/2010 | Yoshida |
| 2012/0115366 A1 | 5/2012 | Suzuki et al. |
| 2017/0215274 A1 | 7/2017 | Yan et al. |
| 2019/0317129 A1 | 10/2019 | Hsieh et al. |
| 2021/0156887 A1 | 5/2021 | Hironaka et al. |
| 2022/0011345 A1 | 1/2022 | Inuma et al. |
| 2022/0018877 A1 | 1/2022 | Inuma et al. |

FOREIGN PATENT DOCUMENTS

| | | |
|---|---|---|
| JP | 2012-098219 A | 5/2012 |
| TW | 201630276 A | 8/2016 |
| TW | 202032136 A | 9/2020 |
| WO | 2018/230627 A1 | 12/2018 |
| WO | 2019/022204 A1 | 1/2019 |
| WO | 2020/111076 A1 | 6/2020 |

OTHER PUBLICATIONS

Office Action mailed Sep. 26, 2024, issed in the corresponding Korean patent application No. 10-2022-7030337 and English machine translation thereof.

\* cited by examiner

CONTACT PROBE, PROBE HOLDER AND PROBE UNIT

FIELD

The present invention relates to a probe unit that accommodates a contact probe that performs signal input and output with respect to a predetermined circuit structure.

BACKGROUND

Conventionally, when conducting state inspection or operating characteristic inspection of an inspection target such as a semiconductor integrated circuit or a liquid crystal panel is performed, a probe unit including a contact probe that electrically connects the inspection target and a signal processing device that outputs an inspection signal and a probe holder that accommodates a plurality of the contact probes is used.

In general, when a high-frequency electric signal is input and output, a loss of a signal called an insertion loss (insertion loss) occurs. In order to operate the probe unit at high speed with high accuracy, it is important to reduce the insertion loss in the frequency domain to be used. For example, Patent Literature 1 discloses a technique of providing an air layer around a contact probe to perform characteristic impedance matching.

CITATION LIST

Patent Literature

Patent Literature 1: JP 2012-98219 A

SUMMARY

Technical Problem

However, in the technique disclosed in Patent Literature 1, although the impedance at the central portion of the contact probe can be adjusted, the characteristic impedance at the distal end portion and the proximal end portion cannot be adjusted.

The present invention has been made in view of the above, and an object thereof is to provide a probe unit capable of adjusting the characteristic impedance of the entire contact probe.

Solution to Problem

To solve the above-described problem and achieve the object, a probe unit according to the present invention includes: a plurality of first contact probes each coming into contact with an electrode to be contacted on one end side in a longitudinal direction; a second contact probe connected to an external ground; and a probe holder configured to hold the first and second contact probes, the probe holder including a first hollow portion configured to allow the first contact probes to be inserted therethrough and hold the first contact probes, a second hollow portion configured to allow the second contact probe to be inserted therethrough and hold the second contact probe, and a through-hole provided around the first hollow portion, wherein the probe holder includes a conductive portion that constitutes the through-hole and electrically connects the through-hole and the second contact probe.

Moreover, in the above-described probe unit according to the present invention, the conductive portion is provided in the through-hole and on a surface forming an opening end of the through-hole.

Moreover, in the above-described probe unit according to the present invention, the through-hole has a stepped hole shape having a partially different diameter.

Moreover, in the above-described probe unit according to the present invention, the through-hole has a stepped hole shape in which central axis positions are different from each other.

Moreover, in the above-described probe unit according to the present invention, the probe holder is formed of one member.

Moreover, in the above-described probe unit according to the present invention, the probe holder is formed by laminating a plurality of members in a penetrating direction of the first hollow portion.

Moreover, in the above-described probe unit according to the present invention, the through-hole is formed by penetration holes formed in the plurality of members, respectively, and has a stepped hole shape in which diameters of the penetration holes are partially different in at least one member.

Moreover, in the above-described probe unit according to the present invention, the through-hole is formed by penetration holes formed in the plurality of members, respectively, and has a stepped hole shape in which central axis positions of the penetration holes are different from each other in at least one member.

Moreover, in the above-described probe unit according to the present invention, in the plurality of members, penetration holes constituting the through-hole are formed, respectively, and in the through-hole, penetration holes formed in members adjacent to each other in a laminating direction of the members at least partially overlap with each other when viewed from a penetrating direction of the penetration holes.

Moreover, in the above-described probe unit according to the present invention, in the through-hole, an opening has an elongated hole shape when viewed from a penetrating direction.

Advantageous Effects of Invention

According to the present invention, it is possible to adjust the characteristic impedance of the entire contact probe.

DESCRIPTION OF EMBODIMENTS

Hereinafter, embodiments of the present invention will be described in detail with reference to the drawings. Note that the present invention is not limited by the following embodiments. In addition, each drawing referred to in the following description merely schematically illustrates a shape, a size, and a positional relationship to such an extent that the contents of the present invention can be understood, and thus the present invention is not limited only to the shape, the size, and the positional relationship illustrated in each drawing.

First Embodiment

Figure 1:
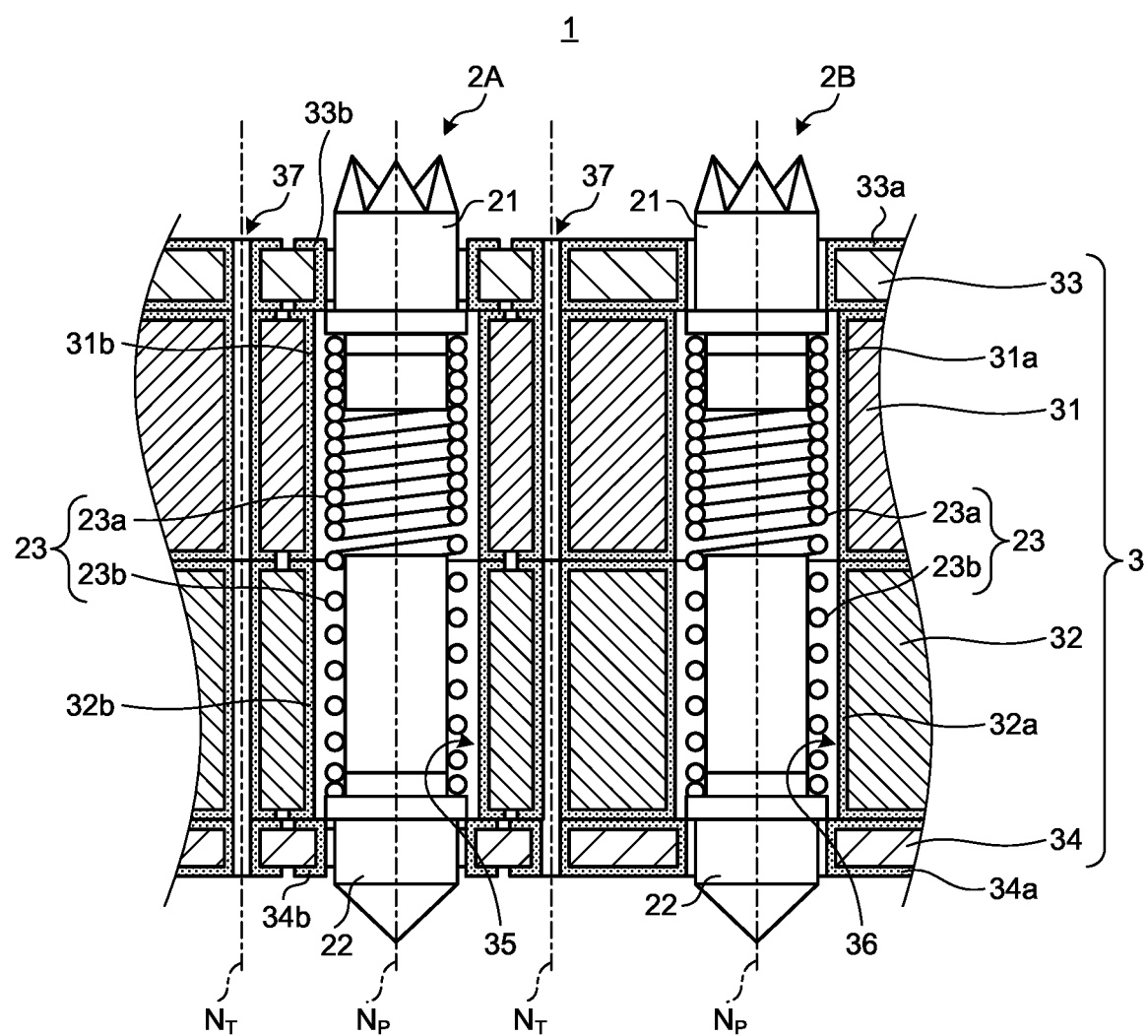
FIG. 1 is a partial cross-sectional view illustrating a configuration of a main portion of a probe unit according to a first embodiment of the present invention.

FIG. 1 is a partial cross-sectional view illustrating a configuration of a main portion of a probe unit according to a first embodiment of the present invention. A probe unit 1 illustrated in FIG. 1 is a device used when an electrical characteristic inspection is performed on a semiconductor integrated circuit as an inspection target, and is a device that electrically connects a semiconductor integrated circuit (a semiconductor integrated circuit 100 to be described later) and a circuit board (a circuit board 200 to be described later) that outputs an inspection signal to the semiconductor integrated circuit.

The probe unit 1 includes a conductive signal contact probe 2A (hereinafter, simply referred to as a "signal probe 2A") that comes into contact with the semiconductor integrated circuit 100 and the circuit board 200, which are two contact objects different from each other, at each end in a longitudinal direction and conducts a signal for inspection, a ground contact probe 2B (hereinafter, simply referred to as a "ground probe 2B") that is connected to an external ground electrode, and a probe holder 3 that accommodates and holds the signal probe 2A and the ground probe 2B according to a predetermined pattern. Note that the probe unit 1 may include a holder member that is provided around the probe holder 3 and suppresses positional displacement of the semiconductor integrated circuit from occurring at the time of inspection.

The signal probe 2A is formed using a conductive material, and includes a first plunger 21 that comes into contact with an electrode to which inspection signal of a semiconductor integrated circuit is input when the semiconductor integrated circuit is inspected, a second plunger 22 that comes into contact with an electrode that outputs an inspection signal of a circuit board including an inspection circuit, and a spring member 23 that is provided between the first plunger 21 and the second plunger 22 and stretchably couples the first plunger 21 and the second plunger 22. The first plunger 21, the second plunger 22, and the spring member 23 constituting the signal probe 2A have the same axis. In the signal probe 2A illustrated in FIG. 1, the longitudinal axes (central axes) of the first plunger 21, the second plunger 22, and the spring member 23 coincide with an axis $N_P$.

When the semiconductor integrated circuit is brought into contact with the signal probe 2A, the spring member 23 expands and contracts to soften impact on a connection electrode of the semiconductor integrated circuit, and applies a load to the semiconductor integrated circuit and the circuit board. Note that in the following description, in the signal probe 2A, a side that comes into contact with the electrode of the semiconductor integrated circuit is defined as a distal end side, and the side opposite to the semiconductor integrated circuit side in the axial direction is defined as a proximal end side. In addition, when the distal end side and the proximal end side are defined by a plunger alone, in the plunger that comes into contact with the semiconductor integrated circuit, the semiconductor integrated circuit side is defined as a distal end side, and the side opposite to the semiconductor integrated circuit side in the axial direction is defined as a proximal end side. In addition, in a plunger that comes into contact with the circuit board, the circuit board side is defined as a distal end side, and the side opposite to the circuit board side in the axial direction is defined as a proximal end side.

The first plunger 21 can move in the axial direction by the expansion and contraction action of the spring member 23, is biased in a direction approaching the semiconductor integrated circuit by an elastic force of the spring member 23 at the time of inspection, and comes into contact with the electrode of the semiconductor integrated circuit. In addition, the second plunger 22 can move in the axial direction by the expansion and contraction action of the spring member 23, is biased in a direction approaching the circuit board by the elastic force of the spring member 23, and comes into contact with the electrode of the circuit board.

In the spring member 23, the first plunger 21 side is a dense wound portion 23a, and the second plunger 22 side is a rough wound portion 23b. An end of the dense wound portion 23a is connected to the first plunger 21. On the other hand, an end of the rough wound portion 23b is connected to the second plunger 22. The first plunger 21 and the second plunger 22 are joined to the spring member 23 by fitting and/or soldering by a winding force of the spring.

The ground probe 2B has the same configuration as that of the signal probe 2A. Specifically, the ground probe 2B is formed using a conductive material, and includes the first plunger 21 that comes into contact with a grounding electrode of a semiconductor integrated circuit when the semiconductor integrated circuit is inspected, the second plunger 22 that comes into contact with a grounding electrode of a circuit board, and the spring member 23 that is provided between the first plunger 21 and the second plunger 22 and stretchably couples the first plunger 21 and the second plunger 22. The first plunger 21, the second plunger 22, and the spring member 23 constituting the ground probe 2B have the same axis. In the ground probe 2B illustrated in FIG. 1, the longitudinal axes (central axes) of the first plunger 21, the second plunger 22, and the spring member 23 coincide with the axis $N_P$.

The probe holder 3 is formed by laminating a first member 31, a second member 32, a third member 33, and a fourth member 34 formed using an insulating material such as resin, machinable ceramic, or silicon. In the probe holder 3 illustrated in FIG. 1, the third member 33, the first member 31, the second member 32, and the fourth member 34 are laminated in this order from the upper side of the figure. The first member 31 to the fourth member 34 are fixed by a known method such as screwing or bonding.

In the probe holder 3, a hollow portion 35 forming a space for accommodating a plurality of the signal probes 2A and a hollow portion 36 forming a space for accommodating a plurality of the ground probes 2B are formed. In addition, in the probe holder 3, a plurality of through-holes 37 is formed around each signal probe 2A.

In the first member 31, a surface forming a surface of the first member 31 is subjected to plating treatment. A conductive material is used for the plating treatment. Therefore, a first conductive film 31a and a second conductive film 31b are formed on the surface of the first member 31. Note that the first conductive film 31a is formed on a surface of a portion, other than the hollow portion 35, including a portion where each through-hole 37 is formed. In addition, the second conductive film 31b is formed on a surface of a portion where the hollow portion 35 is formed. The first conductive film 31a and the second conductive film 31b are separated from each other, and insulation is secured. In the example illustrated in FIG. 1, the film is separated by cutting a part of the film.

Similarly to the first member 31, surfaces of the second member 32 to the fourth member 34 except for a portion forming the inner peripheral surface of the hollow portion 35 are subjected to plating treatment. A first conductive film 32a and a second conductive film 32b are formed on the surfaces of the second member 32. A first conductive film 33a and a second conductive film 33b are formed on the surface of the third member 33. A first conductive film 34a and a second conductive film 34b are formed on the surface of the fourth member 34. The first conductive films 32a to 34a are formed on surfaces of portions, other than the hollow portion 35, including the portions where the through-hole 37 is formed. In addition, the second conductive films 32b to 34b are formed on surfaces of portions where the hollow portion 35 is formed. At least some of the first conductive films 31a to 34a constitute a conductive portion.

Therefore, in the probe holder 3 formed by laminating the first member 31 to the fourth member 34, a conductive film exists at the boundary between the members and on the outer surface.

The hollow portion 35 is formed such that axes of penetration holes formed in the first member 31 to the fourth member 34 coincide with each other. In the hollow portion 35, the second conductive films 31b to 34b are formed on the inner peripheral surface, and a conductive inner peripheral surface is formed. The hollow portion 35 extends in the laminating direction of the first member 31 to the fourth member 34.

The hollow portion 36 is formed such that axes of penetration holes formed in the first member 31 to the fourth member 34 coincide with each other. In the hollow portion 36, the first conductive films 31a to 34a are formed on the inner peripheral surface, and a conductive inner peripheral surface is formed.

The formation positions of the hollow portions 35 and 36 are determined according to the wiring pattern of the semiconductor integrated circuit. The hollow portions 35 and 36 each have a stepped hole shape having different diameters along the penetrating direction. That is, each holder hole includes a small diameter portion having an opening on an end surface of the probe holder 3 and a large diameter portion having a diameter larger than that of the small diameter portion. In the probe holder 3 illustrated in FIG. 1, step portions are formed at the boundary between the first member 31 and the third member 33 and the boundary between the second member 32 and the fourth member 34, respectively. The shape of each holder hole is determined according to the configurations of the signal probe 2A and the ground probe 2B to be accommodated.

The first plunger 21 of the signal probe 2A has a function of preventing the signal probe 2A from coming off the probe holder 3 by a flange abutting on the wall surface of the third member 33. In addition, the second plunger 22 has a function of preventing the signal probe 2A from coming off the probe holder 3 by a flange abutting on the wall surface of the fourth member 34.

The first plunger 21 of the ground probe 2B has a function of preventing the ground probe 2B from coming off the probe holder 3 by a flange abutting on the wall surface of the third member 33. In addition, the second plunger 22 has a function of preventing the ground probe 2B from coming off the probe holder 3 by a flange abutting on the wall surface of the fourth member 34.

The through-hole 37 is formed such that axes of penetration holes formed in the first member 31 to the fourth member 34 coincide with each other. That is, the through-hole 37 is provided from a surface on the distal end side to a surface on the proximal end side of the signal probe 2A in the probe holder 3. In the through-hole 37 illustrated in FIG. 1, the central axis of each penetration hole overlaps with an axis $N_T$. In the through-hole 37, the shape of an opening in a direction orthogonal to the penetrating direction forms a circle. In the through-hole 37, the first conductive films 31a to 34a are formed on the inner peripheral surface, and a conductive inner peripheral surface is formed.

Figure 2:
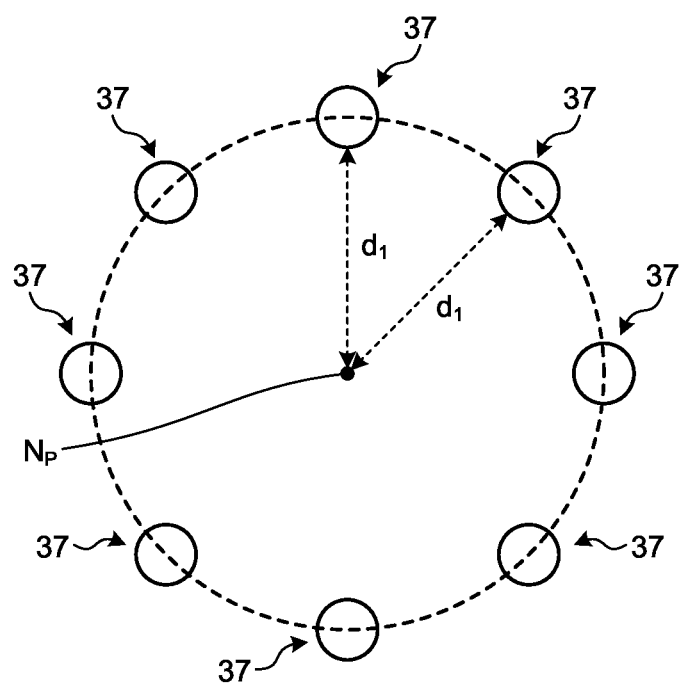
FIG. 2 is a view for explaining an arrangement of through-holes of the probe unit according to the first embodiment of the present invention.

The through-hole 37 forms a cylindrical hollow space, and one or a plurality of the through-holes 37 is formed around the signal probe 2A. In the first embodiment, an example in which eight through-holes 37 are formed around one signal probe 2A will be described. FIG. 2 is a view for explaining an arrangement of through-holes of the probe unit according to the first embodiment of the present invention. For example, the eight through-holes 37 are provided at equal intervals around the arrangement position (axis $N_P$) of the signal probe 2A. In FIG. 2, the diameters of the penetration holes of the through-holes 37 are the same, and the shortest distance between the through-holes 37 and the axis $N_P$ is a same distance $d_1$. That is, the center of a circle (broken line in FIG. 2) passing through the centers of all the through-holes 37 overlaps with the center (axis $N_P$) of the signal probe 2A. A through-hole group including all the through-holes 37 has a coaxial structure with respect to the signal probe 2A.

In the first embodiment, the arrangement position and the number of the through-holes 37, the size of each penetration hole formed by each through-hole 37, and the like are determined such that the characteristic impedance when the signal probe 2A and the ground probe 2B are viewed as one transmission path becomes a preset value (for example, 50Ω).

Figure 3:
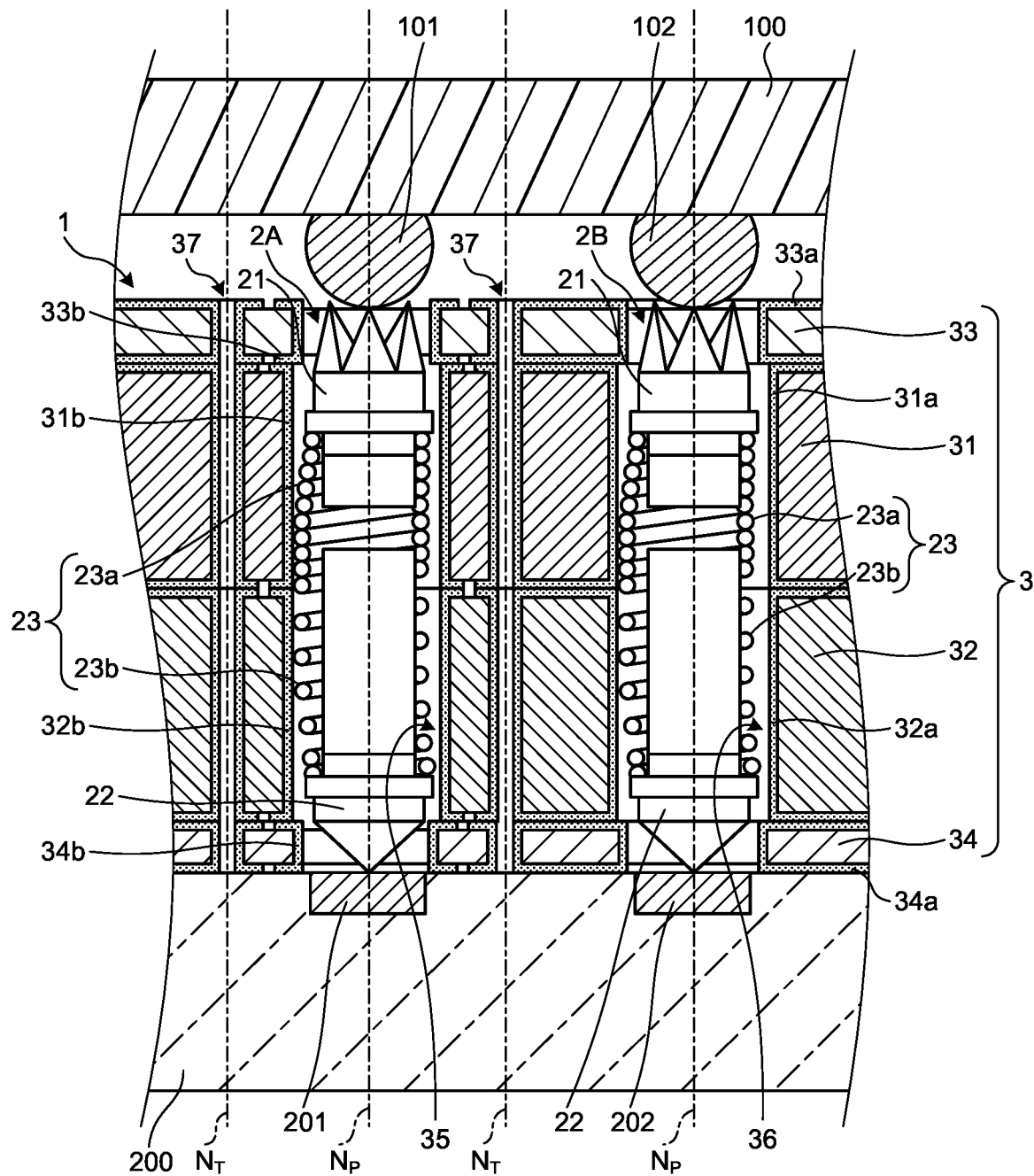
FIG. 3 is a view illustrating a state at the time of inspection of a semiconductor integrated circuit using a probe holder according to the first embodiment of the present invention.

FIG. 3 is a view illustrating a state at the time of inspection of the semiconductor integrated circuit 100 in the probe unit 1. At the time of inspection, in the signal probe 2A, the first plunger 21 comes into contact with an inspection signal electrode 101 of the semiconductor integrated circuit 100, and the second plunger 22 comes into contact with an inspection signal electrode 201 of the circuit board 200. On the other hand, in the ground probe 2B, the first plunger 21 comes into contact with a grounding electrode 102 of the semiconductor integrated circuit 100, and the second plunger 22 comes into contact with a grounding electrode 202 of the circuit board 200. At the time of inspection of the semiconductor integrated circuit 100, the spring member 23 is compressed by a contact load from the semiconductor integrated circuit 100.

For example, an inspection signal supplied from the circuit board 200 to the semiconductor integrated circuit 100 at the time of inspection reaches the electrode 101 of the semiconductor integrated circuit 100 from the electrode 201 of the circuit board 200 via the second plunger 22, the dense wound portion 23a (or the second conductive film), and the first plunger 21 of the signal probe 2A. As described above, in the signal probe 2A, the first plunger 21 and the second plunger 22 are electrically connected via the dense wound portion 23a, so that the conduction path of the electric signal can be minimized. Therefore, it is possible to prevent a signal from flowing to the rough wound portion 23b at the time of inspection and to reduce resistance and inductance. At this time, a path passing through the second plunger 22, the second conductive film, and the first plunger 21 can transmit a signal not through the spring member 23.

In addition, the first plunger 21 of the ground probe 2B comes into contact with the first conductive film 33a or 31a. On the other hand, the second plunger 22 of the ground probe 2B comes into contact with the first conductive film 34a or 32a. Moreover, the spring member 23 of the ground probe 2B comes into contact with the first conductive film 31a or 32a.

In general, in an electronic circuit that handles an AC signal, it is known that a signal is reflected by an amount corresponding to a ratio between different impedances at a portion where wirings having different impedances are connected, and propagation of the signal is hindered. The same applies to the relationship between the semiconductor integrated circuit 100 and the signal probe 2A to be used, and in a case where the characteristic impedance of the semiconductor integrated circuit 100 and the characteristic impedance in the signal probe 2A have greatly different values, the loss of the electric signal occurs and the waveform of the electric signal is distorted.

In addition, the ratio of signal reflection occurring in the connection portion due to the difference in characteristic impedance increases as the speed of the semiconductor integrated circuit 100 increases, that is, as the frequency increases. Therefore, when the probe unit 1 corresponding to the semiconductor integrated circuit 100 driven at a high frequency is manufactured, it is important to accurately perform impedance adjustment in which the value of the characteristic impedance of the signal probe 2A matches that of the semiconductor integrated circuit 100.

However, it is not easy to change the shape and the like of the signal probe 2A from the viewpoint of performing impedance matching. This is because the outer diameter of the signal probe 2A is suppressed to 1 mm or less, and the signal probe 2A is originally limited to having a complicated shape including the first plunger 21, the second plunger 22, and the spring member 23, and thus it is difficult to change the shape to a shape suitable for impedance matching from the viewpoint of design and manufacturing.

Therefore, in the present embodiment, instead of changing the structure of the signal probe 2A, a configuration is adopted in which the value of the characteristic impedance is adjusted by arranging the through-hole 37 around the first plunger 21, the second plunger 22, and the spring member 23. By adopting such a configuration, a conventional structure can be used as the structure of the signal probe 2A. For example, the same probe as the conventional ground probe 2B can be used as the signal probe 2A.

In addition, in the present embodiment, since the shape of the signal probe 2A does not need to be changed to a shape suitable for impedance matching, the degree of freedom of the probe shape to be used can be improved.

Furthermore, in the first embodiment, by providing, around the signal probe 2A, the through-hole 37 extending from the surface on the distal end side to the surface on the proximal end side of the signal probe 2A in the probe holder 3, the value of the characteristic impedance of the distal end portion and the proximal end portion of the signal probe 2A can be adjusted. Specifically, the value of the characteristic impedance can be adjusted by adjusting the number of through-holes to be arranged, the diameters of the penetration holes of the through-holes, and the arrangement of the through-holes (distance to the signal probe 2A). Moreover, by surrounding the signal probe 2A with a plurality of the through-holes 37, it is possible to make the signal probe 2A less susceptible to external factors such as noise and to reduce energy loss due to energy outflow to the outside.

In the first embodiment described above, the through-holes 37 are arranged around the signal probe 2A, and are connected to an external ground via the ground probe 2B. According to the first embodiment, the characteristic impedance of the distal end portion and the proximal end portion of the signal probe 2A can be adjusted by the through-holes 37 indirectly connected to an external ground. According to the first embodiment, it is possible to perform the overall characteristic impedance adjustment including ends of the signal probe 2A. In addition, according to the first embodiment, the ground position in a direction orthogonal to an axial direction with respect to the signal probe 2A can be adjusted by adjusting the position of the through-holes.

In addition, according to the first embodiment described above, since the outer surface of the probe holder 3 is covered with the conductive film, the high frequency characteristics are excellent as compared with the case where the plating treatment is not performed.

In addition, according to the first embodiment described above, since the characteristic impedance can be adjusted by the through-holes, the degree of freedom in the arrangement of the ground probe 2B can be improved.

Note that in the first embodiment described above, the first conductive films 33a and 34a may be connected to an external ground.

In addition, in the first embodiment described above, an example has been described in which a plurality of through-holes is arranged symmetrically with respect to the axis $N_P$ of the signal probe, but the through-holes may be arranged asymmetrically.

In addition, in the above-described first embodiment, an example has been described in which a plurality of through-holes is evenly arranged for one signal probe, but the through-holes may be arranged unevenly. In this case, the term "uneven" may be uneven in that the circumferential distance of the circle centered on one point on the axis $N_P$ of the signal probe is different, may be uneven in that the shortest distance (distance $d_1$ described above) from the axis $N_P$ is different, or may be both.

In addition, in the first embodiment described above, an example has been described in which a conductive film is formed on each member of the probe holder 3, but instead of the film, a conductive plate, a sheet, a film, or the like that is sufficiently thin compared to the thickness of the member may be used.

In addition, in the first embodiment described above, it has been described that the second conductive films 31b to 34b are formed on the surface of the hollow portion 35 to form conductive penetration holes, but an insulating inner peripheral surface may be formed without forming the second conductive film.

(First Modification)

Figure 4:
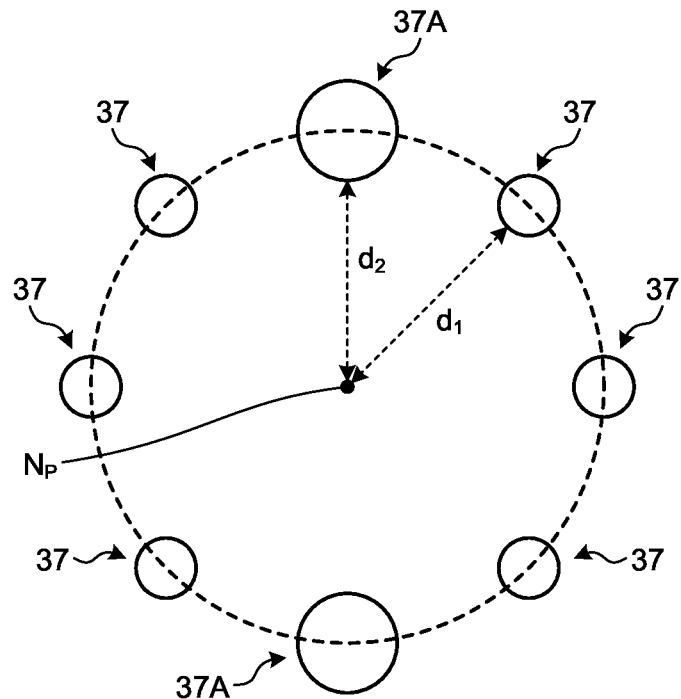
FIG. 4 is a view for explaining an arrangement of through-holes of a probe unit according to a first modification of the first embodiment of the present invention.

FIG. 4 is a view for explaining an arrangement of through-holes of a probe unit according to a first modification of the first embodiment of the present invention. In the probe unit according to the first modification, the sizes of some through-holes in the probe holder 3 described above are different. Other configurations are the same as those of the probe unit 1, and thus the description thereof will be omitted.

In a probe holder according to the first modification, six through-holes 37 and two through-holes 37A are formed around the signal probe 2A. FIG. 4 illustrates an example in which three sets of the through-holes 37 are arranged to face each other with the axis $N_P$ interposed therebetween, and the through-holes 37A are arranged to face each other with the axis $N_P$ interposed therebetween.

Each through-hole 37A is formed such that the axes of penetration holes formed in the first member 31 to the fourth member 34 coincide with each other. The through-hole 37A forms a cylindrical hollow space. In the through-hole 37A, the shape of an opening in a direction orthogonal to the penetrating direction forms a circle. A conductive film (for example, the first conductive films 31a to 34a described above) is formed on an inner peripheral surface of the through-hole 37A, and the inner peripheral surface has conductivity. The diameters of the penetration holes of the through-hole 37A are larger than the diameters of the penetration holes of each through-hole 37.

The through-holes 37 and 37A are arranged at positions where the center of each penetration hole passes through a circle (broken line in FIG. 4) centered on the axis $N_P$ of the signal probe 2A. In addition, a shortest distance $d_2$ between the through-hole 37A and the axis $N_P$ is shorter than the shortest distance $d_1$ between the through-hole 37 and the axis $N_P$.

As in the first modification, the through-holes 37 and 37A having different sizes are arranged around the signal probe 2A, and are connected to an external ground via the ground probe 2B. In the first modification, as in the first embodiment, the characteristic impedances of the distal end portion and the proximal end portion of the signal probe 2A can be adjusted by the through-holes 37 and 37A indirectly connected to an external ground.

(Second Modification)

Figure 5:
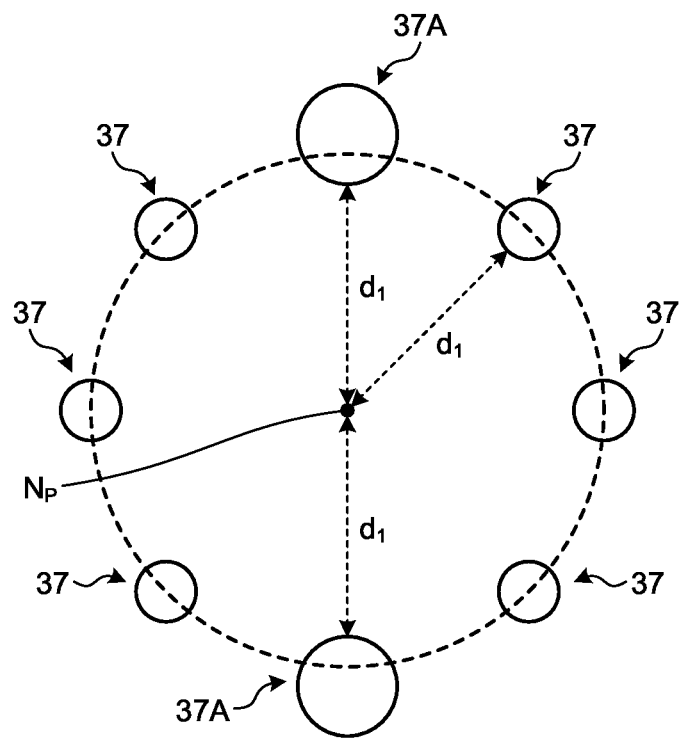
FIG. 5 is a view for explaining an arrangement of through-holes of a probe unit according to a second modification of the first embodiment of the present invention.

FIG. 5 is a view for explaining an arrangement of through-holes of a probe unit according to a second modification of the first embodiment of the present invention. In the probe unit according to the second modification, the sizes and arrangement of some through-holes in the probe holder 3 described above are different. Other configurations are the same as those of the probe unit 1, and thus the description thereof will be omitted.

In the probe holder according to the second modification, six through-holes 37 and two through-holes 37A are formed around the signal probes 2A. FIG. 5 illustrates an example in which three sets of the through-holes 37 are arranged to face each other with the axis $N_P$ interposed therebetween, and the through-holes 37A are arranged to face each other with the axis $N_P$ interposed therebetween.

The through-holes 37 and 37A are arranged at positions where the shortest distance between each through-hole 37 and the axis $N_P$ and the shortest distance between each through-hole 37A and the axis $N_P$ become the same distance $d_1$.

As in the second modification, the through-holes 37 and 37A having different sizes are arranged around the signal probe 2A, and are connected to an external ground via the ground probe 2B. In the second modification, as in the first embodiment, the characteristic impedances of the distal end portion and the proximal end portion of the signal probe 2A can be adjusted by the through-holes 37 and 37A indirectly connected to an external ground.

(Third Modification)

Figure 6:
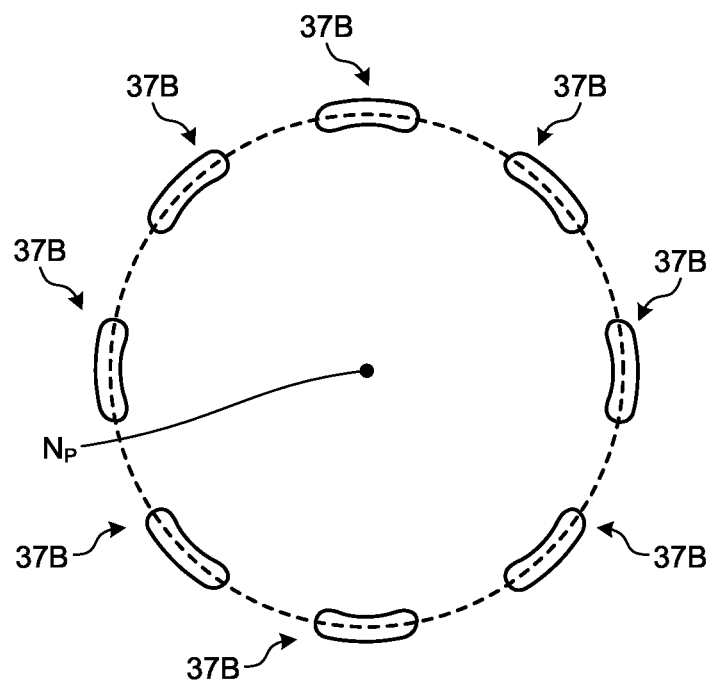
FIG. 6 is a view for explaining an arrangement of through-holes of a probe unit according to a third modification of the first embodiment of the present invention.

FIG. 6 is a view for explaining an arrangement of through-holes of a probe unit according to a third modification of the first embodiment of the present invention. In the probe unit according to the third modification, the sizes and arrangement of some through-holes in the probe holder 3 described above are different. Other configurations are the same as those of the probe unit 1, and thus the description thereof will be omitted.

In the probe holder according to the third modification, eight through-holes 37B are formed around the signal probe 2A. FIG. 6 illustrates an example in which four sets of the through-holes 37B are arranged to face each other with the axis $N_P$ interposed therebetween.

In each through-hole 37B, an opening has an elongated hole shape when viewed from the penetrating direction. The through-holes 37B are arranged at positions where the center of gravity of each penetration hole passes through a circle (broken line in FIG. 6) centered on the axis $N_P$ of the signal probe 2A. In each through-hole 37B, a conductive film (for example, the first conductive films 31a to 34 a described above) is formed on an inner peripheral surface, and the inner peripheral surface has conductivity.

As in the third modification, a plurality of the through-holes 37B is arranged around the signal probe 2A, and is connected to an external ground via the ground probe 2B. In the third modification, as in the first embodiment, the characteristic impedances of the distal end portion and the proximal end portion of the signal probe 2A can be adjusted by the through-holes 37B indirectly connected to an external ground.

In addition, in the third modification, since the opening shape of the penetration hole of each through-hole 37B is an elongated hole, a range surrounding the signal probe 2A by the through-holes 37B is made larger than that of the through-holes 37 and 37 A. As described above, by forming the shape of the through-hole into a shape other than a circle, the degree of freedom in adjusting the characteristic impedance increases, and as a result, the high frequency characteristics of the probe unit can be improved. In addition, by increasing the surrounding range, energy loss due to energy outflow to the outside can be further reduced.

(Fourth Modification)

Figure 7:
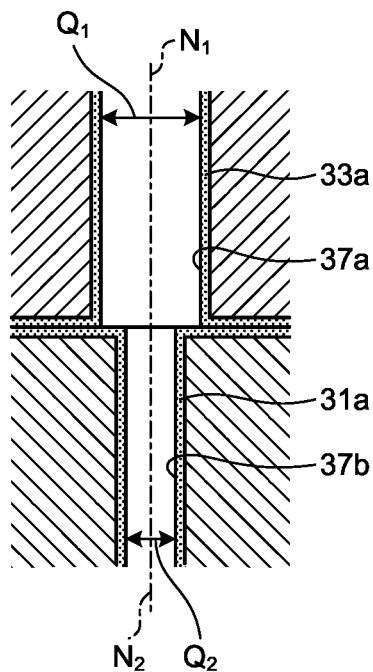
FIG. 7 is a cross-sectional view for explaining a configuration of a main portion of a through-hole of a probe unit according to a fourth modification of the first embodiment of the present invention.

FIG. 7 is a cross-sectional view for explaining a configuration of a main portion of a through-hole of a probe unit according to a fourth modification of the first embodiment of the present invention. In the probe unit according to the fourth modification, the shape of a through-hole in the probe holder 3 described above is different. Other configurations are the same as those of the probe unit 1, and thus the description thereof will be omitted.

The through-hole according to the fourth modification is formed by allowing the penetration holes formed in the first member 31 to the fourth member 34 to communicate with each other. In the through-hole, conductive films (for example, the first conductive films 31a to 34a described above) are formed on the inner peripheral surface, and a conductive inner peripheral surface is formed. The through-hole is partially different in diameter. Specifically, for example, a diameter $Q_1$ of a penetration hole 37a formed in the third member 33 is different from a diameter $Q_2$ of a penetration hole 37b formed in the first member 31. A central axis $N_1$ of the penetration hole 37a and a central axis $N_2$ of the penetration hole 37b are linearly continuous.

As in the fourth modification, by arranging a through-hole having a stepped hole shape around the signal probe 2A, and connecting the through-hole to an external ground via the ground probe 2B, the same effects as those of the first embodiment can be obtained, and characteristic impedance adjustment according to the shape of the signal probe 2A can be performed.

(Fifth Modification)

Figure 8:
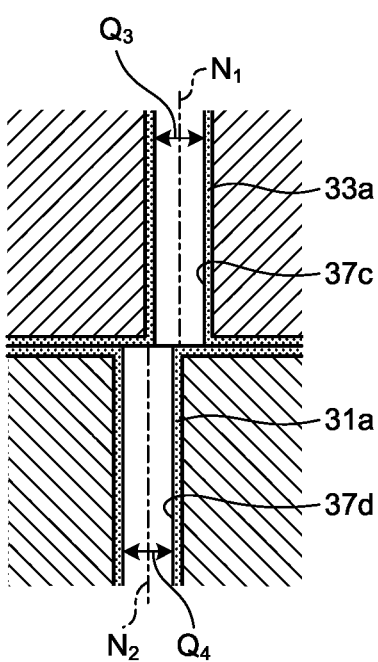
FIG. 8 is a cross-sectional view for explaining a configuration of a main portion of a through-hole of a probe unit according to a fifth modification of the first embodiment of the present invention.

FIG. 8 is a cross-sectional view for explaining a configuration of a main portion of a through-hole of a probe unit according to a fifth modification of the first embodiment of the present invention. In the probe unit according to the fifth modification, the shape of a through-hole in the probe holder 3 described above is different. Other configurations are the same as those of the probe unit 1, and thus the description thereof will be omitted.

The through-hole according to the fifth modification is formed by allowing the penetration holes formed in the first member 31 to the fourth member 34 to communicate with each other. In the through-hole, conductive films (for example, the first conductive films 31a to 34a described above) are formed on the inner peripheral surface, and a conductive inner peripheral surface is formed. The through-hole is a partially different in axis position. Specifically, for example, the central axis $N_1$ of a penetration hole 37c formed in the third member 33 and the central axis $N_2$ of a penetration hole 37d formed in the first member 31 are different in position. In addition, a diameter $Q_3$ of the penetration hole 37c and a diameter $Q_4$ of the penetration hole 37d are the same diameter. As described above, the through-hole according to the fifth modification is formed by the penetration holes in which the position of the central axis is partially different. At this time, when the through-hole is viewed from the laminating direction of the first member 31 to the fourth member 34, the penetration holes formed in the members adjacent to each other in the laminating direction of the members at least partially overlap with each other. The through-hole is formed by the penetration holes formed in the respective members at least partially communicating with each other.

As in the fifth modification, by arranging a through-hole, around the signal probe 2A, having a stepped hole shape in which the axes of some penetration holes are misaligned, and connecting the through-hole to an external ground via the ground probe 2B, the same effects as those of the first embodiment can be obtained, and characteristic impedance adjustment according to the shape of the signal probe 2A can be performed.

(Sixth Modification)

Figure 9:
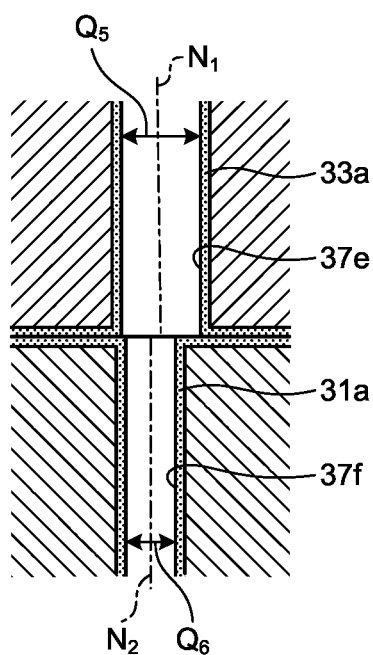
FIG. 9 is a cross-sectional view for explaining a configuration of a main portion of a through-hole of a probe unit according to a sixth modification of the first embodiment of the present invention.

FIG. 9 is a cross-sectional view for explaining a configuration of a main portion of a through-hole of a probe unit according to a sixth modification of the first embodiment of the present invention. In the probe unit according to the sixth modification, the shape of a through-hole in the probe holder 3 described above is different. Other configurations are the same as those of the probe unit 1, and thus the description thereof will be omitted.

The through-hole according to the sixth modification is formed by allowing the penetration holes formed in the first member 31 to the fourth member 34 to communicate with each other. In the through-hole, conductive films (for example, the first conductive films 31a to 34a described above) are formed on the inner peripheral surface, and a conductive inner peripheral surface is formed. The through-hole is a partially different in diameter and axis position. Specifically, for example, a diameter $Q_5$ of a penetration hole 37e formed in the third member 33 is different from a diameter $Q_6$ of a penetration hole 37f formed in the first member 31. In addition, the central axis $N_1$ of the penetration hole 37e and the central axis $N_2$ of the penetration hole 37f are different in position.

As in the sixth modification, by arranging, around the signal probe 2A, a through-hole having a stepped hole shape in which diameters of some penetration holes are different and axes are further shifted, and connecting the through-hole to an external ground via the ground probe 2B, the same effects as those of the first embodiment can be obtained, and characteristic impedance adjustment according to the shape of the signal probe 2A can be performed.

The configurations of the through-holes according to the first to the sixth modifications may be appropriately combined. For example, each signal probe arranged in the same probe holder may be partially different in shape or arrangement.

Second Embodiment

Figure 10:
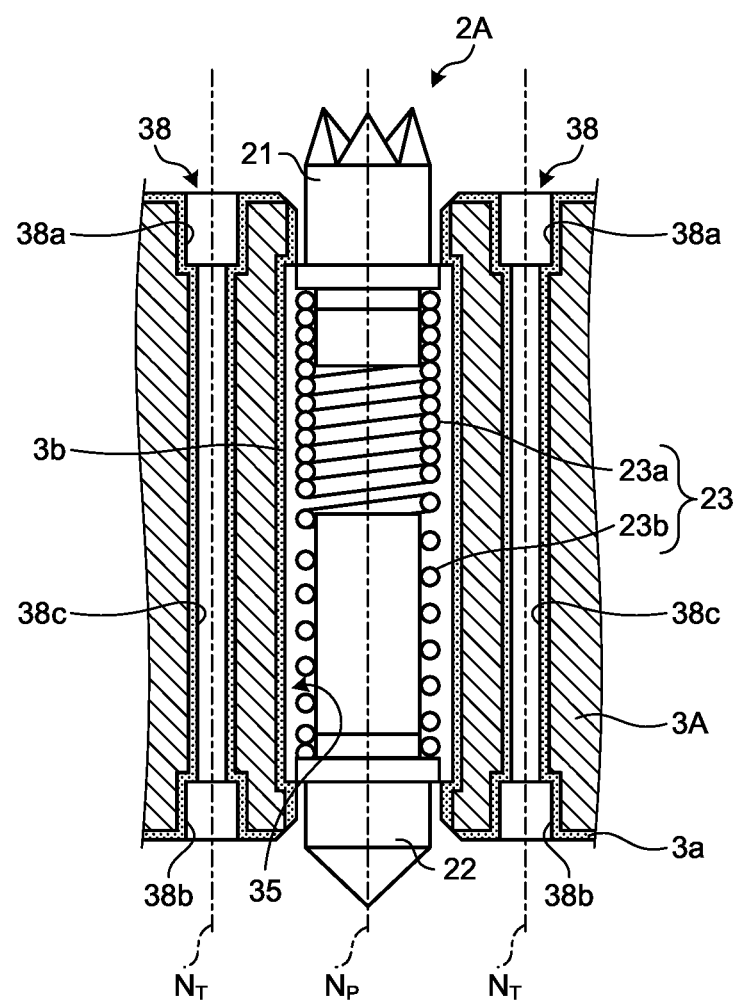
FIG. 10 is a partial cross-sectional view illustrating a configuration of a main portion of a probe unit according to a second embodiment of the present invention.

Next, a second embodiment will be described with reference to FIG. 10. FIG. 10 is a partial cross-sectional view illustrating a configuration of a main portion of a probe unit according to a second embodiment of the present invention. The probe unit according to the second embodiment includes a probe holder 3A instead of the probe holder 3 described above. Other configurations are the same as those of the probe unit 1, and thus the description thereof will be omitted.

The probe holder 3A includes one member formed using an insulating material such as resin, machinable ceramic, or silicon. In the probe holder 3A, the hollow portion 35 forming a space for accommodating a plurality of the signal probes 2A and a hollow portion (the hollow portion 36 described above) forming a space for accommodating a plurality of the ground probes 2B are formed. The hollow portions 35 and 36 each have a hole shape with a diameter that allows a contact probe to be inserted and removed and prevents the contact probe from coming off. In addition, in the probe holder 3A, a plurality of through-holes 38 is formed around each signal probe 2A.

In the probe holder 3A, a surface of the probe holder 3A is subjected to plating treatment. A conductive material is used for the plating treatment. Therefore, a first conductive film 3a and a second conductive film 3b are formed on the surface of the probe holder 3A. The first conductive film 3a is formed on the surface of a portion, other than the hollow portion 35, including a portion where each through-hole 38 is formed. In addition, the second conductive film 3b is formed on a surface of a portion where the hollow portion 35 is formed. The first conductive film 3a and the second conductive film 3b are separated from each other, and insulation is secured.

The through-hole 38 is a penetration hole in which the shape of an opening in a direction orthogonal to the penetrating direction forms a circle and the diameter is partially different. Specifically, the through-hole 38 includes a first hole 38a formed on one surface side (the side on which the first plunger 21 extends in FIG. 10), a second hole 38b formed on another surface side (the side on which the second plunger 22 extends in FIG. 10), and a third hole 38c provided between the first hole 38a and the second hole 38b. The diameters of the openings of the first hole 38a and the second hole 38b are larger than the diameter of the opening of the third hole 38c. In the through-hole 38, the first conductive films 3a is formed on the inner peripheral surface, and a conductive inner peripheral surface is formed. Note that the central axes of the first hole 38a, the second hole 38b, and the third hole 38c are linearly continuous.

The through-hole 38 forms a cylindrical hollow space having a stepped shape having a partially different diameter, and a plurality of the through-holes 38 is formed around the signal probe 2A. For example, as in the first embodiment, eight through-holes 38 are formed around one signal probe 2A.

In the second embodiment described above, the through-holes 38 are arranged around the signal probe 2A, and are connected to an external ground via the ground probe 2B. As a result, according to the second embodiment, the characteristic impedance of the distal end portion and the proximal end portion of the signal probe 2A can be adjusted by the through-holes 38 indirectly connected to the external ground. According to the second embodiment, it is possible to perform the overall characteristic impedance adjustment including ends of the signal probe 2A. In addition, according to the second embodiment, the ground position in a direction orthogonal to an axial direction with respect to the signal probe 2A can be adjusted by adjusting the position of the through-holes.

In addition, in the second embodiment, since the diameter of the penetration hole of each through-hole 38 is made partially different, characteristic impedance adjustment according to the shape of the signal probe 2A can be performed.

Third Embodiment

Figure 11:
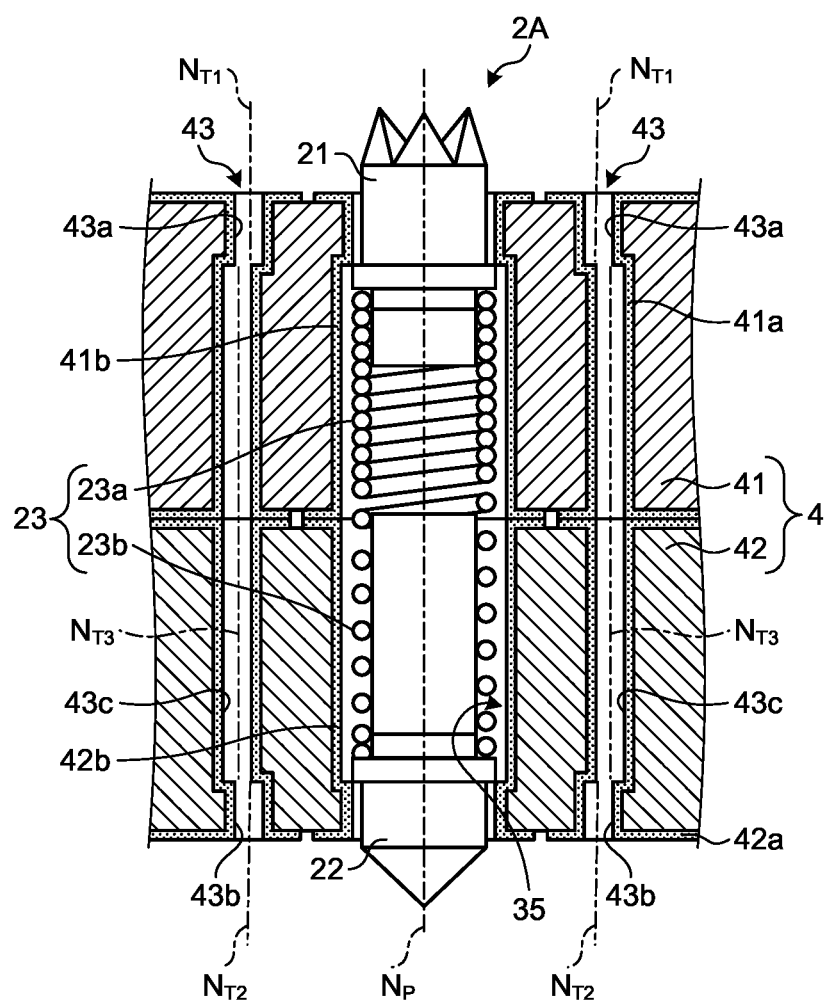
FIG. 11 is a partial cross-sectional view illustrating a configuration of a main portion of a probe unit according to a third embodiment of the present invention.

Next, a third embodiment will be described with reference to FIG. 11. FIG. 11 is a partial cross-sectional view illustrating a configuration of a main portion of a probe unit according to a third embodiment of the present invention. The probe unit according to the third embodiment includes a probe holder 4 instead of the probe holder 3 described above. Other configurations are the same as those of the probe unit 1, and thus the description thereof will be omitted.

The probe holder 4 is formed by laminating a first member 41 and a second member 42 formed using an insulating material such as resin, machinable ceramic, or silicon. In the probe holder 4 illustrated in FIG. 11, the first member 41 and the second member 42 are laminated in this order from the upper side of the figure. The first member 41 and the second member 42 are fixed by a known method such as screwing or bonding.

In the probe holder 4, the hollow portion 35 forming a space for accommodating a plurality of the signal probe 2A and a hollow portion (not illustrated) forming a space for accommodating a plurality of the ground probes 2B are formed. In addition, in the probe holder 4, a plurality of through-holes 43 is formed around each signal probe 2A.

In the first member 41, a surface forming a surface of the first member 41 is subjected to plating treatment. A conductive material is used for the plating treatment. Therefore, a first conductive film 41a and a second conductive film 41b are formed on the surface of the first member 41. Note that the first conductive film 41a is formed on the surface of a portion, other than the hollow portion 35, including a portion where each through-hole 43 is formed. In addition, the second conductive film 41b is formed on a surface of a portion where the hollow portion 35 is formed. The first conductive film 41a and the second conductive film 41b are separated from each other, and insulation is secured.

Similarly to the first member 41, in the second member 42, a surface forming a surface of the second member 42 is subjected to plating treatment. A first conductive film 42a and a second conductive film 42b are formed on the surface of the second member 42. Note that the first conductive film 42a is formed on the surface of a portion, other than the hollow portion 35, including a portion where each through-hole 43 is formed. In addition, the second conductive film 42b is formed on a surface of a portion where the hollow portion 35 is formed. The first conductive film 42a and the second conductive film 42b are separated from each other, and insulation is secured.

Therefore, in the probe holder 4 formed by laminating the first member 41 and the second member 42, a conductive film exists at the boundary between the members and on the outer surface.

The hollow portion 35 is formed such that axes of penetration holes formed in the first member 41 and the second member 42 coincide with each other. In the hollow portion 35, the second conductive films 41b and 42b are formed on the inner peripheral surface, and a conductive inner peripheral surface is formed.

The through-hole 43 is a penetration hole having a stepped shape in which the shape of an opening in a direction orthogonal to the penetrating direction forms a circle and the position of the central axis is partially different. Specifically, the through-hole 43 includes a first hole 43a formed on one surface side (the side on which the first plunger 21 extends in FIG. 11) of the probe holder 4, a second hole 43b formed on another surface side (the side on which the second plunger 22 extends in FIG. 11), and a third hole 43c provided between the first hole 43a and the second hole 43b. The diameters of the openings of the first hole 43a, the second hole 43b, and the third hole 43c are the same. In addition, central axes $N_{T1}$ and $N_{T2}$ of the first hole 43a and the second hole 43b and a central axis $N_{T3}$ of the third hole 43c are different from each other in position within a range where adjacent holes communicate with each other. In the through-hole 43, the first conductive films 41a and 42a are formed on the inner peripheral surface, and a conductive inner peripheral surface is formed.

The through-hole 43 forms a cylindrical hollow space having a stepped shape, and a plurality of the through-holes 43 is formed around the signal probe 2A. For example, as in the first embodiment, eight through-holes 43 are formed around one signal probe 2A.

In the third embodiment described above, the through-holes 43 are arranged around the signal probe 2A, and are connected to an external ground via the ground probe 2B. As a result, according to the third embodiment, the characteristic impedance of the distal end portion and the proximal end portion of the signal probe 2A can be adjusted by the through-holes 43 indirectly connected to the external ground. According to the third embodiment, it is possible to perform the overall characteristic impedance adjustment including ends of the signal probe 2A. In addition, according to the third embodiment, the ground position in a direction orthogonal to an axial direction with respect to the signal probe 2A can be adjusted by adjusting the position of the through-holes.

In addition, in the third embodiment, since the position of the central axis is made partially different in each penetration hole of each through-hole 43, characteristic impedance adjustment according to the shape of the signal probe 2A can be performed.

The first to the third embodiments and the modifications thereof described above can be appropriately combined. It is also possible to individually select and adopt the configuration of each contact probe from the arrangement or shape of the through-holes of the embodiments and the first to the third modifications.

Note that the configurations of the contact probe described here are merely examples, and various types of conventionally known probes can be applied. For example, the probe is not limited to including the plunger and the coil spring described above, and may be a probe including a pipe member, a wire probe that bends a pogo pin, a solid conductive member, a conductive pipe, or a wire in an arch shape to obtain a load, a connection terminal (connector) that connects electrical contacts, or a combination of these probes as appropriate.

In addition, the probe holder according to the first to third embodiments and the modifications thereof described above is configured by laminating four or two members or configured by one member, but may be configured by laminating three members or five or more members.

In addition, in the first to the third embodiments and the modifications thereof described above, the conductive film may be partially pattern-formed without being formed on the entire member surface of the probe holder 3 as long as the through-hole and the ground probe 2B can be electrically connected. For example, the conductive film may be formed on a portion constituting the through-hole and an outer surface of a member constituting an opening end of the through-hole (for example, the third member 33 and the fourth member 34 illustrated in FIG. 1). At this time, the conductive film is electrically connected to the ground probe 2B at least at the time of inspection.

As described above, the present invention can include various embodiments and the like not described herein, and various design changes and the like can be made without departing from the technical idea specified by the claims.

INDUSTRIAL APPLICABILITY

As described above, the probe unit according to the present invention is suitable for adjusting the characteristic impedance of the entire contact probe.

REFERENCE SIGNS LIST

1 PROBE UNIT
2A CONTACT PROBE (SIGNAL PROBE)
2B CONTACT PROBE (GROUND PROBE)
3, 3A, 3B PROBE HOLDER
3a, 31a to 34a, 41a, 42a FIRST CONDUCTIVE FILM
3b, 31b to 34b, 41b, 42b SECOND CONDUCTIVE FILM
21 FIRST PLUNGER
22 SECOND PLUNGER
23 SPRING MEMBER
23a DENSE WOUND PORTION
23b ROUGH WOUND PORTION
31, 41 FIRST MEMBER
32, 42 SECOND MEMBER
33 THIRD MEMBER
34 FOURTH MEMBER
35, 36 HOLLOW PORTION
37, 37A, 37B, 38, 43 THROUGH-HOLE
100 SEMICONDUCTOR INTEGRATED CIRCUIT
101, 102, 201, 202 ELECTRODE
200 CIRCUIT BOARD

The invention claimed is:

1. A probe unit comprising:
   a plurality of first contact probes each coming into contact with an electrode to be contacted on one end side in a longitudinal direction;
   a second contact probe connected to an external ground; and
   a probe holder configured to hold the first and second contact probes, the probe holder including
     a first hollow portion configured to allow the first contact probes to be inserted therethrough and hold the first contact probes,
     a second hollow portion configured to allow the second contact probe to be inserted therethrough and hold the second contact probe, and
     a through-hole provided around the first hollow portion, wherein
   the probe holder includes a conductive portion that constitutes the through-hole and electrically connects the through-hole and the second contact probe.

2. The probe unit according to claim 1, wherein the conductive portion is provided in the through-hole and on a surface forming an opening end of the through-hole.

3. The probe unit according to claim 1, wherein the through-hole has a stepped hole shape having a partially different diameter.

4. The probe unit according to claim 1, wherein the through-hole has a stepped hole shape in which central axis positions are different from each other.

5. The probe unit according to claim 1, wherein the probe holder is formed of one member.

6. The probe unit according to claim 1, wherein the probe holder is formed by laminating a plurality of members in a penetrating direction of the first hollow portion.

7. The probe unit according to claim 6, wherein
the through-hole is formed by penetration holes formed in the plurality of members, respectively, and
has a stepped hole shape in which diameters of the penetration holes are partially different in at least one member.

8. The probe unit according to claim 6, wherein
the through-hole is formed by penetration holes formed in the plurality of members, respectively, and
has a stepped hole shape in which central axis positions of the penetration holes are different from each other in at least one member.

9. The probe unit according to claim 6, wherein
in the plurality of members, penetration holes constituting the through-hole are formed, respectively, and
in the through-hole, penetration holes formed in members adjacent to each other in a laminating direction of the members at least partially overlap with each other when viewed from a penetrating direction of the penetration holes.

10. The probe unit according to claim 1, wherein in the through-hole, an opening has an elongated hole shape when viewed from a penetrating direction.

\* \* \* \* \*